United States Patent
Fujimoto

(10) Patent No.: US 7,187,002 B2
(45) Date of Patent: Mar. 6, 2007

(54) WAFER COLLECTIVE RELIABILITY EVALUATION DEVICE AND WAFER COLLECTIVE RELIABILITY EVALUATION METHOD

(75) Inventor: Keiichi Fujimoto, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 168 days.

(21) Appl. No.: 11/033,390

(22) Filed: Jan. 12, 2005

(65) Prior Publication Data
US 2005/0167783 A1    Aug. 4, 2005

(30) Foreign Application Priority Data
Feb. 2, 2004    (JP)    ............................. 2004-025965

(51) Int. Cl.
*H01L 23/58* (2006.01)
(52) U.S. Cl. .................. 257/48; 257/536; 257/E23.179
(58) Field of Classification Search .................. 257/48
See application file for complete search history.

(56) References Cited

U.S. PATENT DOCUMENTS

2003/0112025 A1* 6/2003 Hamilton et al. ........... 324/760

FOREIGN PATENT DOCUMENTS

| JP | 57-102009 | 6/1982 |
| JP | 06-151537 | 5/1994 |
| JP | 11-126807 | 5/1999 |
| JP | 11-150166 | 6/1999 |
| JP | 11-251378 | 9/1999 |

* cited by examiner

*Primary Examiner*—Tu-Tu Ho
(74) *Attorney, Agent, or Firm*—McDermott Will & Emery LLP

(57) ABSTRACT

A wafer collective reliability evaluation device comprises a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer. The reliability evaluation wafer comprises a plurality of reliability evaluation elements formed on a main body of a semiconductor wafer, a plurality of electrodes for applying voltage or current to the respective reliability evaluation elements via the respective metal terminals and a plurality of heating elements formed in the vicinity of the respective reliability evaluation elements and serving to control temperatures of the respective reliability evaluation elements.

33 Claims, 9 Drawing Sheets

WAFER COLLECTIVE RELIABILITY EVALUATION DEVICE AND WAFER COLLECTIVE RELIABILITY EVALUATION METHOD

CROSS REFERENCE

All of matters disclosed in the scope of claims, specification and drawings of Japanese Patent Application No. 2004-25965 filed on Feb. 2, 2004 are incorporated herein by reference.

BACKGROUND OF THE INVENTION

The present invention relates to an evaluation device and an evaluation method for performing a collective reliability evaluation with respect to a plurality of reliability evaluation elements formed on a semiconductor wafer.

In recent years, a semiconductor element is expected to respond to such requirements as a continuous operation for a long period of time and a stable operation at a high temperature, in which the reliability evaluation for the semiconductor element is indispensable. Further, it is requested that the reliability evaluation be performed in a wafer state in order to improve the productivity and the reliability evaluation be collectively performed in the wafer state in accordance with an increasingly enlarging diameter of the wafer. As another point to be noted, operation conditions required for the semiconductor element are becoming more demanding, in response to which there is an increasingly higher expectation for performing the evaluation at a higher temperature and under more precise temperature conditions.

Hereinafter, reliability evaluation devices, which are conventionally used in the wafer state, are described referring to FIGS. 13 and 14.

(First Example of Conventional Art)

FIG. 13 is a schematic illustration of an evaluation pattern of a reliability evaluation device for performing the reliability evaluation in the wafer state according to a first conventional example (see Japanese Unexamined Patent Publication No. 06-151537 of the of the).

In FIG. 13, a heating element 101 using a conductive layer selectively formed by means of, for example, ion implantation is formed on a semiconductor wafer, and a reliability evaluation pattern 103 is formed on the heating element 101 via an insulation film (not shown). The reliability evaluation pattern 103 is connected to electrodes 104a, 104b, 104c and 104d. The heating element 101 is connected to ohmic electrodes 102a and 102b. A probe terminal of a prober is brought into contact with the electrodes 104a, 104b, 104c and 104d to thereby apply voltage or current to the evaluation pattern 103 so as to perform the reliability evaluation. At that time, current is applied to the heating element 101 via the ohmic electrodes 102a and 102b to thereby generate heat from the heating element 101 so as to control a temperature of the evaluation pattern 103.

The foregoing configuration has advantages that the temperature of the evaluation pattern can be precisely controlled and a heat balance can be reached in a short period of time because the heating element is disposed immediately below the evaluation pattern.

(Second Example of Conventional Art)

FIG. 14 is a schematic illustration of a reliability evaluation device using a wafer collective probe capable of collectively performing an inspection and reliability evaluation with respect to an entire surface of the wafer according to a second conventional example (see No. 2828410 of the Publication of the Patented Patents).

Referring to reference numerals in FIG. 14, 111 denotes a semiconductor wafer, 112 denotes a wafer collective probe and 113 denotes a wafer tray. Electrodes 111a and reliability evaluation elements 111b are formed on the semiconductor wafer 111. The electrodes 111a and the reliability evaluation elements 111b are electrically connected.

As shown in FIG. 14, the wafer collective probe 112 comprises a wiring substrate 112a, an anisotropic conductive rubber 112b and bumps 112c. The bumps 112c are provided in positions in the wafer collective probe 112 corresponding to the electrodes 111a on the semiconductor wafer 111. The wiring substrate 112 and the bumps 112c are electrically connected by means of the anisotropic conductive rubber 112b.

In the state shown in FIG. 14, the electrodes 111a on the semiconductor wafer 111 and the bumps 112c on the wafer collective probe 112 are electrically connected. Thereafter, voltage or current is applied to the respective reliability evaluation elements 111b on the semiconductor wafer 111 to thereby perform the reliability evaluation. Further, a heater is directly brought into contact with the wafer tray retaining the semiconductor wafer so as to uniformly control a temperature of the entire surface of the semiconductor wafer 111.

According to the foregoing configuration, the wafer can be collectively evaluated, which includes such an advantage as a large reduction of evaluation time.

According to the configuration according to the first conventional example, however, only a few or so can be evaluated at a time because the probe terminal of the prober is used. The first conventional example thus includes a problem that an enormous amount of time is consumed for evaluating the entire surface of the wafer or a variation in the wafer surface due to the fact that the reliability evaluation generally requires tens of hours or more in one evaluation.

According to the second conventional example, the anisotropic conductive rubber 112b constituting the wafer collective probe has a low heat resistance. For example, when the evaluation is continued at, for example, 150° C. or more, the anisotropic conductive rubber 112b is apparently deteriorated, which largely increases a conductive resistance thereof. This creates a problem that the reliability evaluation can only be performed in a narrow temperature range.

The second conventional example includes further problems that a variation is generated in actual evaluation temperatures of the respective reliability evaluation elements because the reliability evaluation elements are collectively heated by the heater, which is brought into contact with the wafer tray, and further, the actual evaluation temperature of each reliability evaluation element cannot be precisely known.

SUMMARY OF THE INVENTION

A main object of the present invention is to realize a wafer collective reliability evaluation device and a wafer collective reliability evaluation method capable of solving the problems generated in the conventional technology and collectively performing a reliability evaluation test with respect to the wafer in a short period of evaluation time and under broad-ranging and precise temperature conditions.

In order to achieve the object, a wafer collective reliability evaluation device according to the present invention is constituted in such manner that a temperature of a wafer collective probe is not increased to a high degree when a plurality of reliability evaluation elements formed on the reliability evaluation wafer are collectively evaluated at a high temperature.

More specifically, a first wafer collective reliability evaluation device according to the present invention comprises a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, and is characterized in that the reliability evaluation wafer comprises a plurality of reliability evaluation elements formed on a main body of a semiconductor wafer, a plurality of electrodes for applying voltage or current to the respective reliability evaluation elements via the respective metal terminals and a plurality of heating elements formed in a vicinity of the respective reliability evaluation elements and serving to control temperatures of the respective reliability evaluation elements.

According to the first wafer collective reliability evaluation device, the temperatures of the respective reliability evaluation elements are precisely controlled by the heating elements. Therefore, the reliability evaluation can be performed under precise temperature conditions, and further, the reliability evaluation can be performed at a predetermined temperature eliminating the possibility of increasing the temperatures to such a high degree as deteriorating the conductive elastic sheet provided in the wafer collective probe in contact with the electrodes because it is unnecessary to heat the entire wafer tray.

In the foregoing case, it is preferable for the plurality of heating elements to be heating resistor elements and it is preferable to further provide a temperature control power supply for applying voltage or current to the respective heating resistor elements. Such a configuration realizes an easy temperature control in the heating element part.

Further, in the foregoing case, it is preferable for the reliability evaluation wafer to include temperature sensors provided in the vicinity of the reliability evaluation elements and serving to measure the temperatures of the reliability evaluation elements and it is preferable for the temperature sensors to be temperature measuring resistor elements in which resistance values change in response to a temperature.

Moreover, it is preferable to further comprise temperature sensors using infrared ray for measuring the temperatures of the reliability evaluation elements provided outside the wafer collective probe.

Moreover, it is preferable to further comprise a control circuit for adjusting a value of voltage or current applied to the respective heating resistor elements by the temperature control power supply in response to measurement results of the temperature sensors. According to the configuration, the temperatures of the reliability evaluation elements can be precisely controlled, thereby performing the reliability evaluation under the precise temperature conditions.

Further there may be comprised infrared-ray temperature sensors for measuring the temperatures of the reliability evaluation elements provided outside the wafer collective probe and a control circuit for adjusting an output of the temperature control power supply in response to outputs of the infrared-ray temperature sensors. Such a configuration can also enables the reliability evaluation to be surely performed under the precise temperature conditions.

A second wafer collective reliability evaluation device according to the present invention comprises a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, and is characterized in that the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and the respective heating elements and the respective electrodes are disposed at a distance therebetween so that temperatures of the respective electrodes are equal to or below a temperature at which the conductive elastic sheet starts to deteriorate when the respective reliability evaluation elements are heated to a predetermined evaluation temperature by the respective heating elements formed on the reliability evaluation wafer.

According to the second wafer collective reliability evaluation device, heat from the heating elements is not directly transferred to the electrodes and released through a rear surface of the wafer. Therefore, there is no temperature increase to such a high degree as to deteriorate the conductive elastic sheet provided in the wafer collective probe in contact with the electrodes, and the reliability evaluation can be accordingly performed at the predetermined temperature.

In the second wafer collective reliability evaluation device, it is preferable to satisfy a relationship represented by $D > \{\log(T-25) - \log(125)\} \times 2.5$ when a maximum degree of the predetermined evaluation temperature is T° C. and the distance between the respective electrodes and the heating elements is D mm. According to the foregoing arrangement, the wafer collective probe is prevented from reaching 150° C. or more, at which the deterioration is accelerated, and the reliability evaluation can be accordingly performed at a desired temperature.

In the second wafer collective reliability evaluation device, it is preferable for the distance between the respective electrodes and heating elements to be 0.5 mm or more.

A third wafer collective reliability evaluation device according to the present invention comprises a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, and is characterized in that the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and respective electrodes, and the respective electrodes are formed on a heat insulation material provided on the main body of the semiconductor wafer.

According to the third wafer collective reliability evaluation device, heat from the heating elements is not directly transferred to the electrodes and released through a rear surface of the wafer. Therefore, there is no temperature increase to such a high degree as to deteriorate the conductive elastic sheet provided in the wafer collective probe, and the reliability evaluation can be accordingly performed at a predetermined temperature.

Further, it is preferable for the heat insulation material to be a surface protective resin film formed on the main body of the semiconductor wafer. Accordingly, the reliability evaluation can be easily performed through the application of a conventional process. Further, it is preferable for the heat insulation material to be made of a material whose heat conductivity is 1 W/m·K or below.

A fourth wafer collective reliability evaluation device according to the present invention comprises a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, and is characterized in that the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and dummy metal terminals for releasing heat are provided in the surface of the conductive elastic sheet of the wafer collective probe, the dummy metal terminals being in contact with a surface of the reliability evaluation wafer between the respective electrodes and heating elements.

According to the fourth wafer collective reliability evaluation device, heat from the heating elements is released along the way to thereby control a temperature increase at the electrodes. As a result, there is no temperature increase to such a high degree as to deteriorate the conductive elastic sheet provided in the wafer collective probe, and the reliability evaluation can be accordingly performed at a predetermined temperature.

Further, it is preferable for the dummy metal terminals constituted in such manner as being connected to the reliability evaluation wafer via intervening dummy electrodes formed in the surface of the reliability evaluation wafer. In such a manner, the heat can be further released.

It is preferable for the wafer collective reliability evaluation device according to the present invention to further comprise a wafer tray for retaining the reliability evaluation wafer and to be constituted so as to cool off the reliability evaluation wafer by supplying cooling air to a surface of the wafer tray on an opposite side with respect to a wafer retaining surface thereof or a surface of the wafer collective probe on an opposite side with respect to a surface thereof facing the reliability evaluation wafer. A cooling effect can be thereby enhanced.

A fifth wafer collective reliability evaluation device according to the present invention comprises a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer and a wafer tray for retaining the reliability evaluation wafer, and is characterized in that the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and a cooling means for selectively cooling off a region near the respective electrodes.

According to the fifth wafer collective reliability evaluation device, a temperature increase in a vicinity of the electrodes can be controlled when the heating elements reach a high temperature. Therefore, there is no temperature increase to such a high degree as to deteriorate the conductive elastic sheet provided in the wafer collective probe, and the reliability evaluation can be accordingly performed at a predetermined temperature.

In the fifth wafer collective reliability evaluation device, it is preferable for the cooling means to be provided in an upper part of the wafer tray and have a projection shape in contact with a surface of the reliability evaluation wafer on an opposite side with respect to a region thereof where the electrodes are formed.

In the fifth wafer collective reliability evaluation device, it is preferable for the cooling means to be Pertier elements incorporated into a region in a reverse surface of the wafer tray near the electrodes.

In the fifth wafer collective reliability evaluation device, it is preferable for the cooling means to be cooling air supplied to the region in the reverse surface of the wafer tray near the electrodes.

In the wafer collective reliability evaluation device according to the present invention, it is preferable for the plurality of heating elements to be heating resistor elements and it is preferable for a temperature control power supply for applying voltage or current to the respective heating resistor elements to be further provided. A temperature increase in the heating element part can be thereby easily controlled.

Further, in the foregoing case, it is preferable for the reliability evaluation wafer to include temperature sensors provided in the vicinity of the reliability evaluation elements and serving to measure temperatures of the reliability evaluation elements, and it is preferable for the temperature sensors to be temperature measuring resistor elements in which resistance values change in response to a temperature.

It is preferable for the wafer collective reliability evaluation device according to the present invention to further comprise temperature sensors using infrared ray for measuring the temperatures of the reliability evaluation elements provided outside the wafer collective probe.

It is preferable for the wafer collective reliability evaluation device according to the present invention to further comprise a control circuit for adjusting a value of voltage or current applied to the respective heating resistor elements by the temperature control power supply in response to measurement results of the temperature sensors. In the foregoing configuration, the temperatures of the reliability evaluation elements can be still precisely controlled, thereby performing the reliability evaluation under the precise temperature conditions.

It is preferable for the wafer collective reliability evaluation device according to the present invention to further comprise infrared-ray temperature sensors for measuring the temperatures of the reliability evaluation elements provided outside the wafer collective probe and a control circuit for adjusting an output of the temperature control power supply in response to outputs of the infrared-ray temperature sensors. Such a configuration also enables the reliability evaluation to be performed under precise temperature conditions.

A sixth wafer collective reliability evaluation device according to the present invention comprises a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, and is characterized in that the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and the plurality of heating elements are heated by infrared ray emitted from a light source disposed outside the wafer collective probe to thereby adjust temperatures of the respective reliability evaluation elements.

According to the sixth wafer collective reliability evaluation device, only the heating elements can be easily selectively heated, and a temperature increase in the electrode part can be thereby controlled. As a result, there is no temperature increase to such a high degree as to deteriorate the conductive elastic sheet provided in the wafer collective probe, and the reliability evaluation can be accordingly performed at a predetermined temperature.

In the sixth wafer collective reliability evaluation device, it is preferable for the wiring substrate to be provided with a light reflecting film formed on an upper or lower surface thereof. Accordingly, a temperature rise in the wafer collective probe due to the infrared ray can be controlled to a minimum level.

A seventh wafer collective reliability evaluation device according to the present invention comprises a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, a wafer tray for retaining the reliability evaluation wafer and a heating means provided in a surface of the wafer tray on an opposite side with respect to a wafer retaining surface thereof, and is characterized in that the reliability evaluation wafer comprises a plurality of reliability evaluation elements formed on a main body of a semiconductor wafer, a plurality of electrodes for applying voltage or current to the respective reliability evaluation elements via the respective metal terminals and a plurality of wirings for electrically connecting the respective reliability evaluation elements and the respective electrodes, and further, the plurality of electrodes is formed in an peripheral edge part of the reliability evaluation wafer and the wafer tray is in contact with a lower surface inward of the peripheral edge part of the reliability evaluation wafer where the respective electrodes are formed.

According to the seventh wafer collective reliability evaluation device, heat from the wafer tray is not easily transferred to the electrodes, which enables a temperature increase in the electrode part to be controlled despite the reliability evaluation elements at a high temperature. As a result, there is no temperature increase to such a high degree as to deteriorate the conductive elastic sheet provided in the wafer collective probe, and the reliability evaluation can be accordingly performed at a predetermined temperature.

In the seventh wafer collective reliability evaluation device, it is preferable for the heating means to be a heating element provided in contact with the wafer tray. Further, it is preferable for the reliability evaluation wafer further to include dummy electrodes formed on the main body of the semiconductor wafer and it is preferable for the wafer collective probe to further include dummy metal terminals provided in a position in the surface of the conductive elastic sheet facing the dummy electrodes. Such a configuration enables the wafer collective probe to be surely retained on the reliability evaluation wafer.

A first wafer collective reliability evaluation method according to the present invention uses a reliability evaluation wafer including a plurality of reliability evaluation elements formed on a main body of a semiconductor wafer, a plurality of heating elements formed in a vicinity of the respective reliability evaluation elements and serving to control temperatures of the respective reliability evaluation elements and a plurality of electrodes respectively electrically connected to the plurality of reliability evaluation elements and a wafer collective probe including a wiring substrate, a conductive elastic sheet provided in a surface of the wiring substrate and a plurality of metal terminals provided in a surface of the conductive elastic sheet, and is characterized in comprising a step for electrically connecting the respective metal terminals of the wafer collective probe to the respective electrodes of the reliability evaluation wafer, a step for increasing temperatures of the respective reliability evaluation elements to a predetermined evaluation temperature by generating heat from the respective heating elements and a step for collectively evaluating damaged states of the respective reliability evaluation elements by means of the wafer collective probe electrically connected to the respective reliability evaluation elements via the respective electrodes and metal terminals.

According to the first wafer collective reliability evaluation method, only the reliability evaluation elements can be precisely heated and a temperature increase in the electrodes can be controlled. Therefore, there is no temperature increase to such a high degree as to deteriorate the conductive elastic sheet provided in the wafer collective probe in contact with the electrodes, and the reliability evaluation can be accordingly performed at a predetermined temperature.

In the wafer collective reliability evaluation method according to the present invention, it is preferable for the plurality of heating elements to be heating resistor elements and it is preferable to generate heat from the respective heating resistor elements by applying voltage or current to the respective heating resistor elements. According to the foregoing configuration, the respective reliability evaluation elements can be precisely heated, and the reliability evaluation can be therefore performed under precise temperature conditions.

In the wafer collective reliability evaluation method according to the present invention, it is preferable for the reliability evaluation wafer to comprise temperature measuring resistor elements in which resistance values change in response to a temperature in the vicinity of the respective reliability evaluation elements. It is also preferable to further include a step for measuring the temperatures of the respective reliability evaluation elements by measuring the resistance values of the respective temperature measuring resistor elements and a step for controlling the temperatures of the respective reliability evaluation elements by adjusting heat generation volumes of the respective heating elements in response to the measured temperatures of the respective reliability evaluation elements. According to such a configuration, the reliability evaluation can be performed under more precise temperature conditions. Further, any unnecessary temperature increase can be controlled to thereby prevent the conductive elastic sheet provided in the wafer collective probe from deteriorating.

In the wafer collective reliability evaluation method according to the present invention, it is preferable to further include a step for measuring the temperatures of the respective reliability evaluation elements by measuring radiation energy of the infrared ray emitted from the respective heating elements and a step for controlling the temperatures of the respective reliability evaluation elements by adjusting the heat generation volumes of the respective heating elements in response to the measured temperatures of the respective reliability evaluation elements.

According to the foregoing configuration, no complicated process is required for the formation of the temperature measuring resistor elements to thereby simplify the temperature measurement. Thereby, a highly precise reliability evaluation can be easily performed.

According to the wafer collective reliability evaluation device according to the present invention, a wafer collective reliability evaluation device and a wafer collective reliability evaluation method, wherein a reliability evaluation test can be collectively performed with respect to the wafer in a short period of evaluation time and under broad-ranging and precise temperature conditions, can be realized.

DETAILED DESCRIPTION OF THE INVENTION (First Embodiment)

Figure 1:
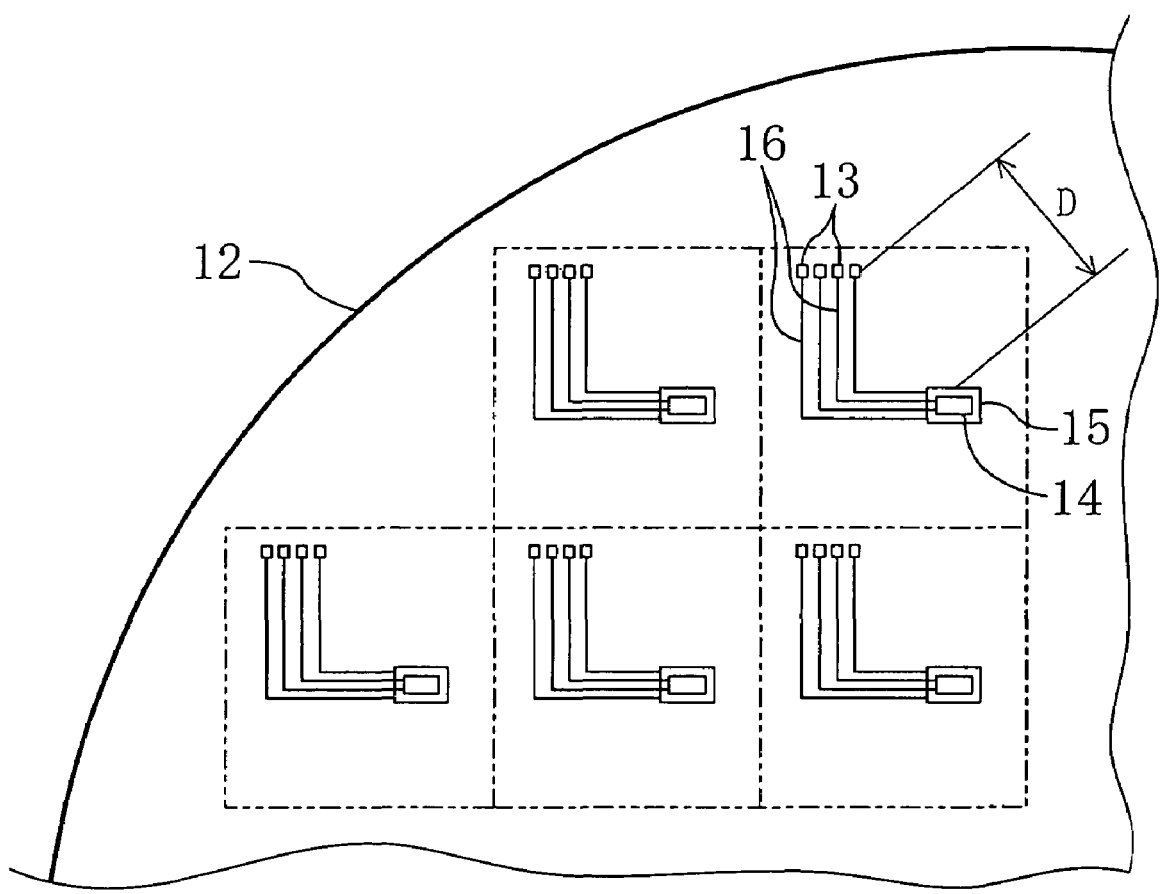
FIG. 1 is a partial schematic view of an evaluation wafer used for a wafer collective reliability evaluation according to a first embodiment of the present invention.
Figure 2:
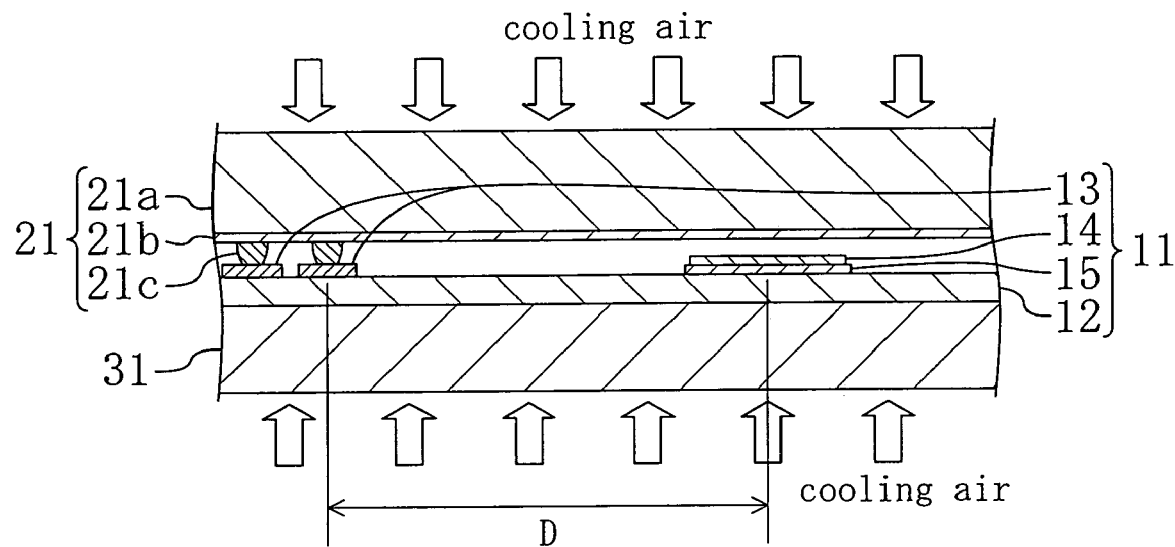
FIG. 2 is a partial sectional view of a wafer collective probe and a reliability evaluation wafer according to the first embodiment of the present invention when the probe is brought into contact with the wafer.
Figure 3:
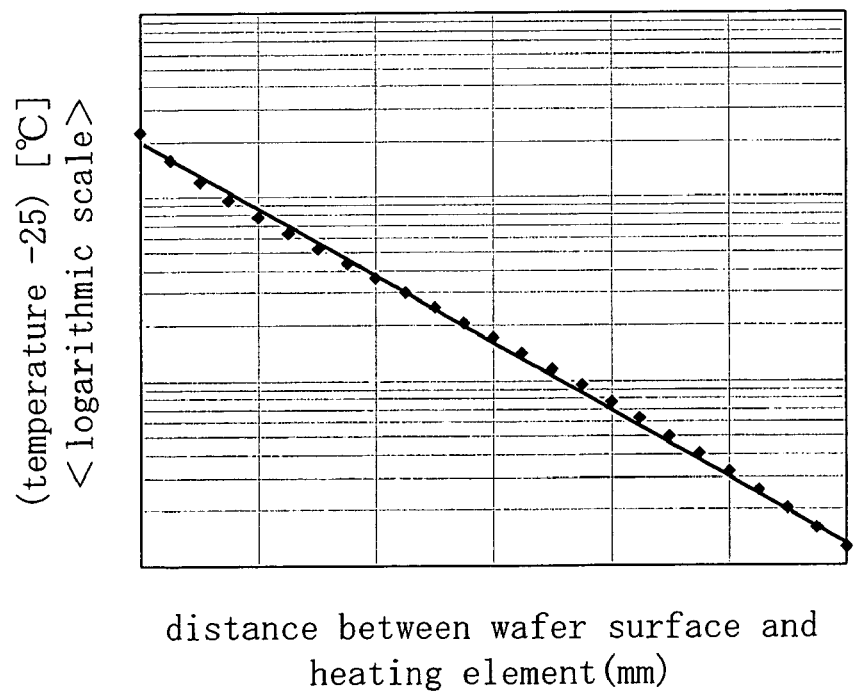
FIG. 3 is a graph showing a temperature of the reliability evaluation wafer according to the first embodiment of the present invention.

A wafer collective reliability evaluation device according to a first embodiment of the present invention is described referring to FIGS. 1, 2 and 3.

FIG. 1 shows a plane view of a reliability evaluation wafer used for a wafer collective reliability evaluation according to the present embodiment.

As shown in FIG. 1, on a main body of a semiconductor wafer 12 which is a substrate of the reliability evaluation wafer, a plurality of reliability evaluation elements 14 and heating resistor elements 15 are formed so as to respectively contact the plurality of reliability evaluation elements 14. Voltage or current applied to the respective heating resistor elements 15 is controlled to thereby generate heat from the respective heating elements 15 or halt the heat generation so that temperatures of the respective reliability evaluation elements are adjusted.

The heating resistor elements 15 are not necessarily in contact with the reliability evaluation elements 14 and only required to be disposed in a vicinity of the reliability evaluation elements 14.

To the reliability evaluation elements 14 can be applied an element for insulation film evaluation of transistor, an electromigration evaluation element of wiring, or the like. It is preferable to form the heating resistor elements 15 from a material, which can be easily handled for the formation thereof in a semiconductor process and has a thermal stability, such as polysilicon, titanium nitride and tungsten.

Further, electrodes 13 for applying voltage or current to the reliability evaluation elements 14 and the heating resistor elements 15 are formed at a distance D relative to the heating resistor elements 15. The reliability evaluation elements 14 and the heating resistor elements 15 are respectively electrically connected to the electrodes 13 by means of wirings 16.

FIG. 2 shows a partial sectional view of a wafer collective probe and the reliability evaluation wafer according to the present embodiment in the state in which the probe is made to contact with the wafer.

As shown in FIG. 2, a reliability evaluation wafer 11 is retained on a wafer tray 31. A wafer collective probe 21 is disposed so as to face the reliability evaluation wafer 11.

An anisotropic conductive rubber 21b is provided on a surface, which faces the reliability evaluation wafer 11, of a wiring substrate 21a provided in the wafer collective probe 21. Bumps 21c are provided in a surface of the anisotropic conductive rubber 21b and connected to the electrodes 13 provided in the reliability evaluation wafer 11.

The present embodiment is characterized in that the electrodes 13 for applying voltage or current to the reliability evaluation elements 14 and the heating resistor elements 15 are formed at the distance D relative to the heating resistor elements 15, and the reliability evaluation elements 14 and the heating resistor elements 15 are respectively electrically connected to the electrodes 13 by means of the wirings 16 (not shown). In the state shown in FIG. 2, the reliability evaluation elements 14 and the heating resistor elements 15 are supplied with voltage or current from a temperature control power supply and a stress application power supply disposed outside of the wafer collective probe 21 via the wiring substrate 21a, anisotropic conductive rubber 21b, bumps 21c, electrodes 13 and wirings 16.

Further, it is preferable to blow cooling air from a surface of the wafer tray 31 on an opposite side with respect to a wafer retaining surface thereof (hereinafter, referred to as reverse surface) and a surface of the wafer collective probe 21 on an opposite side with respect to a surface facing the reliability evaluation wafer (hereinafter, referred to as upper surface) as in the present embodiment. In the present embodiment, the cooling air is blown from the two directions, that is, from the reverse surface of the wafer tray 31 and the upper surface of the wafer collective probe 21, however, the cooling air may be blown from the reverse surface of the wafer tray 31 or the upper surface of the wafer collective probe 21.

Here, the distance D shown in FIGS. 1 and 2 is described referring to FIG. 3. FIG. 3 shows a temperature distribution on a wafer surface when temperatures of the heating resistor elements 15 are controlled to be T° C. at the time of performing the reliability evaluation and the reverse surface of the wafer tray 31 having a thickness of 10 mm is stabilized at 25° C. by the cooling air.

Axis X denotes "distance mm from the wafer surface to the heating elements", and axis Y denotes "(temperature−25)<logarithmic scale>° C.". The graph can be approximated by a substantially straight line, and represented by the following approximate expression (1) when an evaluation temperature is T° C.

$$Y \cong 10\{\log(T-25)-0.4X\} \quad \text{expression (1)}$$

When replaced by X, the following approximate expression (2) can be obtained.

$$X \cong \{\log(T-25)-\log(Y)\} \times 2.5 \quad \text{expression (2)}$$

Because the anisotropic conductive rubber 21b of the wafer collective probe 21 significantly deteriorates, thereby increasing its conductive resistance when reaching 150° C. or more, it is necessary for the electrodes 13 to be 150° C. or below. Therefore, the distance D between the electrodes 13 and the heating resistor elements 15 requires D>{log(T−25)−log(150−25)}×2.5, that is, D>{log(T−25)−log(125)}×2.5.

The distance D is preferably 0.5 mm or above in many instances because of D>0.64 mm when the reliability evaluation temperature is 250° C.

As described above, according to the present embodiment, the electrodes 13 and the heating resistor elements 15 are formed providing the distance D therebetween. Therefore, there is no temperature increase to such a high degree as deteriorating the anistropic conductive rubber 21b, which potentially exhibits a significant deterioration at a high temperature, and the wafer collective reliability evaluation can be realized at a predetermined temperature.

Further, when the heating resistor elements 15 are used as the heating elements as in the present embodiment, voltage or current can be collectively applied to the heating resistor elements 15 to thereby collectively control the temperatures of the heating resistor elements 15, and further, voltage or current can be individually applied to the heating resistor elements 15 to thereby individually control the temperatures of the heating resistor elements 15.

(Second Embodiment)

Figure 4:
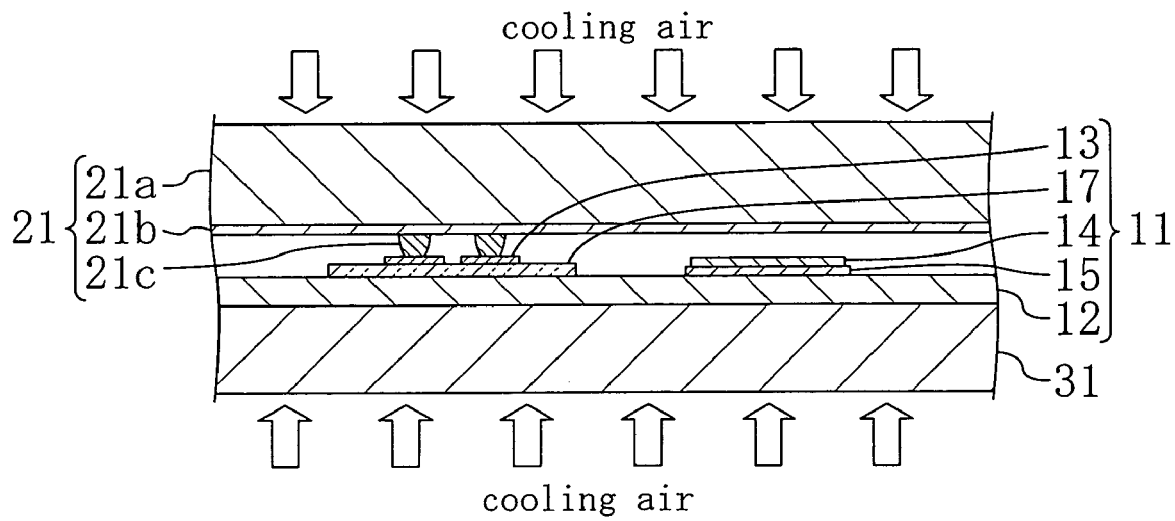
FIG. 4 is a partial sectional view of a wafer collective probe and a reliability evaluation wafer according to a second embodiment of the present invention when the probe is brought into contact with the wafer.

A wafer collective reliability evaluation device according to a second embodiment of the present invention is described referring to FIG. 4.

FIG. 4 is a partial sectional view of a wafer collective probe and a reliability evaluation wafer according to the present embodiment in the state in which the probe is made to contact with the wafer.

As shown in FIG. 4, the reliability evaluation wafer 11 is retained on the wafer tray 31, and the wafer collective probe 21 is disposed so as to face the reliability evaluation wafer 11.

The anisotropic conductive rubber 21b is provided on the surface, which faces the reliability evaluation wafer 11, of the wiring substrate 21a provided in the wafer collective probe 21. The bumps 21c are provided in the surface of the anisotropic conductive rubber 21b and connected to the electrodes 13 provided in the reliability evaluation wafer 11.

The heating resistor elements 15 are formed on the semiconductor-wafer main body 12, which is the substrate of the reliability evaluation wafer 11, and the reliability evaluation elements 14 are formed on the heating resistor elements 15. The electrodes 13 for applying voltage or current to the reliability evaluation elements 14 and the heating resistor elements 15 are provided on a surface protection resin film 17 made of polyamide resin as a heat insulation material formed on the semiconductor-wafer main body 12. The reliability evaluation elements 14 and the heating resistor elements 15 are respectively connected to the electrodes 13 by means of the wirings 16 (not shown).

The heating resistor elements 15 reach a high temperature when the reliability evaluation is performed, from which heat is transferred to the semiconductor-wafer main body 12, and temperatures of the electrodes provided on the semiconductor-wafer main body 12 are thereby increased to reach a high temperature. However, the electrodes 13 provided on the surface protection resin film 17 according to the present embodiment can be subjected to a heat insulation effect and prevent a resultant heat increase because a heat conductivity of the polyamide resin constituting the surface protection resin film 17 is 0.2 W/m·K, which shows quite a small value, in contrast to a heat conductivity of the silicon wafer being 120 W/m·K. Thus, the electrodes 13 are heat-insulated. Therefore, there is no temperature increase to such a high degree as deteriorating the anistropic conductive rubber 21b, which potentially exhibits a significant deterioration at a high temperature, and the wafer collective reliability evaluation can be realized at a predetermined temperature.

The surface protection resin film 17 can be formed on the semiconductor-wafer main body 12 by means of a publicly known step for forming the surface protection resin film in the semiconductor wafer.

In the present embodiment, the surface protection resin film 17 made of polyamide resin is used as a heat insulation material, however, the material for the film is not limited to the polyamide resin and the same effect can be expected using any material having a heat conductivity of 1 W/m·K or below.

It is preferable, as recited in the present embodiment, to blow the cooling air from the reverse-surface side of the wafer tray 31 and the upper surface of the wafer collective probe 21. In the present embodiment, the cooling air is blown from the two directions of the reverse-surface side of the wafer tray 31 and the upper surface of the wafer collective probe 21, however, the cooling air may be blown from the reverse-surface side of the wafer tray 31 or the upper surface of the wafer collective probe 21.

When the heating resistor elements 15 are used as the heating elements as in the present embodiment, the temperatures of the heating resistor elements 15 can be collectively controlled by collectively applying voltage or current thereto, and also, the temperatures of the heating resistor elements 15 can be individually controlled by individually applying voltage or current thereto.

(Third Embodiment)

Figure 5:
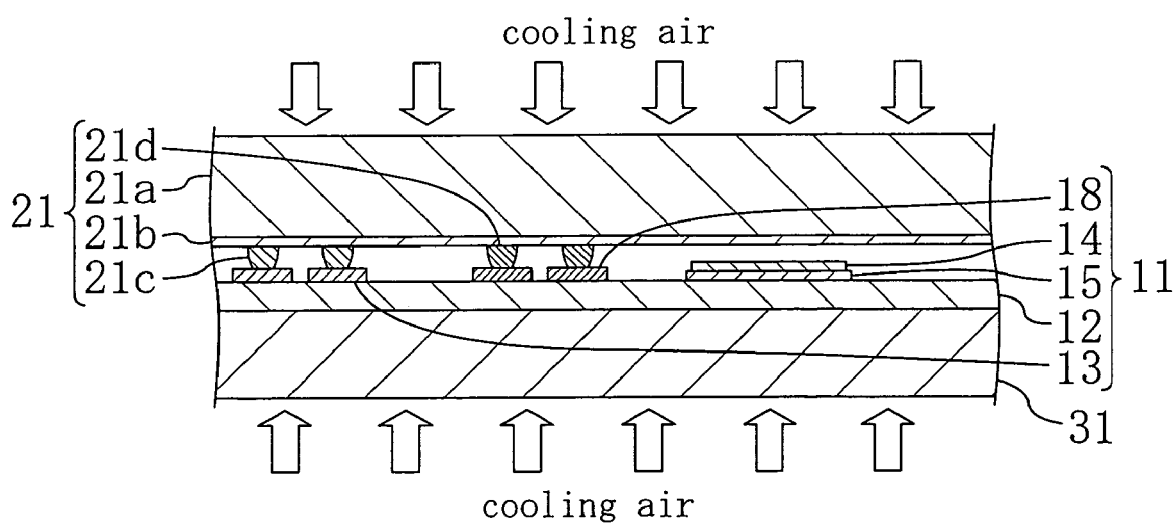
FIG. 5 is a partial sectional view of a wafer collective probe and a reliability evaluation wafer according to a third embodiment of the present invention when the probe is brought into contact with the wafer.

A wafer collective reliability evaluation device according to a third embodiment of the present invention is described referring to FIG. 5.

FIG. 5 is a partial sectional view of a wafer collective probe and a reliability evaluation wafer according to the present embodiment in the state in which the probe is made to contact with the wafer.

As shown in FIG. 5, the reliability evaluation wafer 11 is retained on the wafer tray 31, and the wafer collective probe 21 is disposed so as to face the reliability evaluation wafer 11.

The anisotropic conductive rubber 21b is provided on the surface, which faces the reliability evaluation wafer 11, of the wiring substrate 21a provided in the wafer collective probe 21. The bumps 21c and dummy bumps 21d are provided in the surface of the anisotropic conductive rubber 21b, and the bumps 21c and dummy bumps 21d are connected to the electrodes 13 and dummy electrodes 18 provided in the reliability evaluation wafer 11, respectively.

The heating resistor elements 15 are formed on the semiconductor-wafer main body 12, which is the substrate of the reliability evaluation wafer 11, and the reliability evaluation elements 14 are formed on the heating resistor elements 15. The dummy electrodes 18 are provided between the electrodes 13 for applying voltage or current to the reliability evaluation elements 14 and the heating resistor elements 15, and the heating resistor elements 15. The reliability evaluation elements 14 and the heating resistor elements 15 are respectively connected to the electrodes 13 by means of the wirings 16 (not shown).

The temperatures of the heating resistor elements 15 are increased when the reliability evaluation is performed, from which heat is transferred to the semiconductor-wafer main body 12, and the temperatures of the electrodes provided on the semiconductor-wafer main body 12 are thereby increased. In the present embodiment, however, the dummy electrodes 18, to which the dummy bumps 21d are connected, are provided between the heating resistor elements 15 and the electrodes 13. In such a configuration, the heat is released in an upper direction of the wiring substrate 21a via the dummy bumps 21d, which prevents the temperatures of the electrodes 13 from increasing. Therefore, there is no temperature increase to such a high degree as deteriorating the anistropic conductive rubber 21b, which potentially exhibits a significant deterioration at a high temperature, and the wafer collective reliability evaluation can be realized at a predetermined temperature.

In the present embodiment, the dummy electrodes 18 are formed on the semiconductor-wafer main body 12 and made to contact with the dummy bumps 21d. However, the dummy bumps 21d may directly contact with the semiconductor-wafer main body 12 without forming the intervening dummy electrodes 18, from which the same effect can be expected.

Further, it is preferable, as recited in the present embodiment, to blow the cooling air from the reverse-surface side of the wafer tray 31 and the upper surface of the wafer collective probe 21. In the present embodiment, the cooling air is blown from the two directions of the reverse-surface side of the wafer tray 31 and the upper surface of the wafer collective probe 21, however, the cooling air may be blown from the reverse-surface side of the wafer tray 31 or the upper surface of the wafer collective probe 21.

When the heating resistor elements 15 are used as the heating elements as in the present embodiment, the temperatures of the heating resistor elements 15 can be collectively controlled by collectively applying voltage or current thereto, and also, the temperatures of the heating resistor elements 15 can be individually controlled by individually applying voltage or current thereto.

(Fourth Embodiment)

Figure 6:
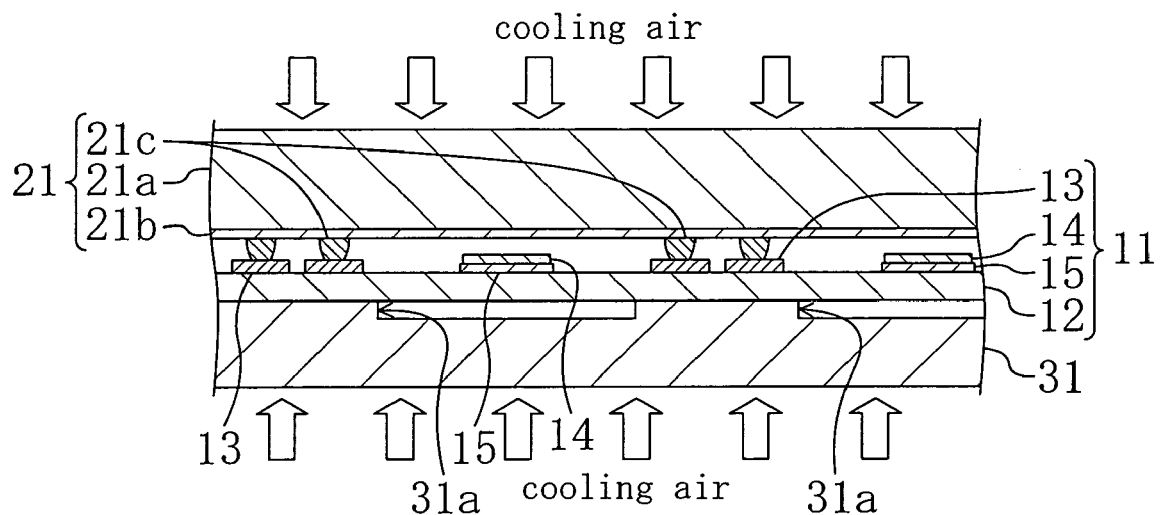
FIG. 6 is a partial sectional view of a wafer collective probe and a reliability evaluation wafer according to a fourth embodiment of the present invention when the probe is brought into contact with the wafer.

A wafer collective reliability evaluation device according to a fourth embodiment of the present invention is described referring to FIG. 6.

FIG. 6 is a partial sectional view of a wafer collective probe and a reliability evaluation wafer according to the present embodiment in the state in which the probe is made to contact with the wafer.

As shown in FIG. 6, the reliability evaluation wafer 11 is retained on the wafer tray 31, and the wafer collective probe 21 is disposed so as to face the reliability evaluation wafer 11.

The anisotropic conductive rubber 21b is provided on the surface, which faces the reliability evaluation wafer 11, of the wiring substrate 21a provided in the wafer collective probe 21. The bumps 21c are provided in the surface of the anisotropic conductive rubber 21b and connected to the electrodes 13 provided in the reliability evaluation wafer 11.

The heating resistor elements 15 are formed on the semiconductor-wafer main body 12, which is the substrate of the reliability evaluation wafer 11, and the reliability evaluation elements 14 are formed on the heating resistor elements 15. The electrodes 13 for applying voltage or current to the reliability evaluation elements 14 and the heating resistor elements 15 are connected to the respective reliability evaluation elements 14 and heating resistor elements 15 by means of the wirings 16 (not shown).

A plurality of projections 31a is provided in an upper part of the wafer tray 31. The projections 31a are configured in such manner as making a contact with the semiconductor-wafer main body 12 only in a reverse surface of a region where the electrodes 13 are provided in the semiconductor-wafer main body 12.

The heating resistor elements 15 reach a high temperature when the reliability evaluation is performed, from which heat is transferred to the semiconductor-wafer main body 12, and the temperatures of the electrodes provided on the semiconductor-wafer main body 12 are thereby increased. However, according to the present embodiment, only the reverse surface of the region of the semiconductor-wafer main body 12 where the electrodes 13 are formed is in contact with the projections 31a of the wafer tray 31 and heat in the electrodes 13 and a peripheral part thereof is released to the wafer tray 31 through the projections 31a. Accordingly, only the electrodes and the peripheral part thereof are selectively cooled off, as a result of which the temperature of the anisotropic conductive rubber 21b is not increased to a high degree at which the deterioration thereof starts. Therefore, there is no temperature increase to such a high degree as deteriorating the anistropic conductive rubber 21b, which potentially exhibits a significant deterioration at a high temperature, and the wafer collective reliability evaluation can be realized at a predetermined temperature.

Further, it is preferable, as recited in the present embodiment, to blow the cooling air from the reverse-surface side of the wafer tray 31 and the upper surface of the wafer collective probe 21. In the present embodiment, the cooling air is blown from the two directions of the reverse-surface side of the wafer tray 31 and the upper surface of the wafer collective probe 21, however, the cooling air may be blown from the reverse-surface side of the wafer tray 31 or the upper surface of the wafer collective probe 21.

Figure 7:
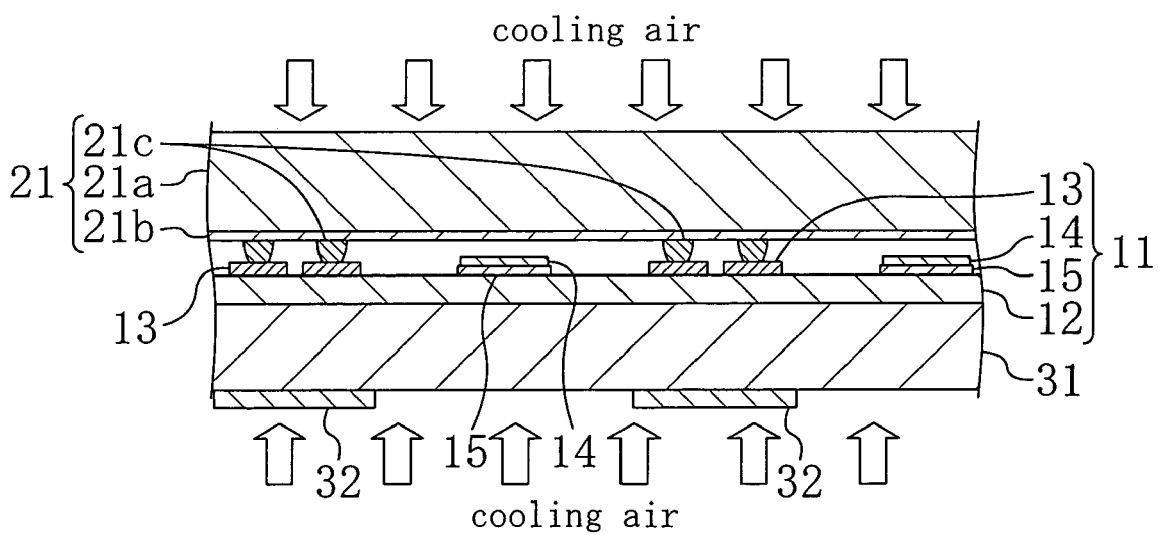
FIG. 7 is a partial sectional view of the wafer collective probe and the reliability evaluation wafer according to the fourth embodiment when the probe is brought into contact with the wafer.

In the present embodiment, the projections are provided in the upper part of the wafer tray 31, however, only the vicinity of the electrodes 13 can be also selectively cooled off according to an alternative configuration, which is shown in FIG. 7, wherein Pertier elements 32 are incorporated into a part near the electrodes 13 in the reverse surface of the wafer tray. Further, the same effect can be achieved by blowing the cooling air to the vicinity of the electrodes 1-3 in the reverse surface of the wafer tray.

When the heating resistor elements 15 are used as the heating elements as in the present embodiment, the temperatures of the heating resistor elements 15 can be collectively controlled by collectively applying voltage or current thereto, and also, the temperatures of the heating resistor elements 15 can be individually controlled by individually applying voltage or current thereto.

(Fifth Embodiment)

Figure 8:
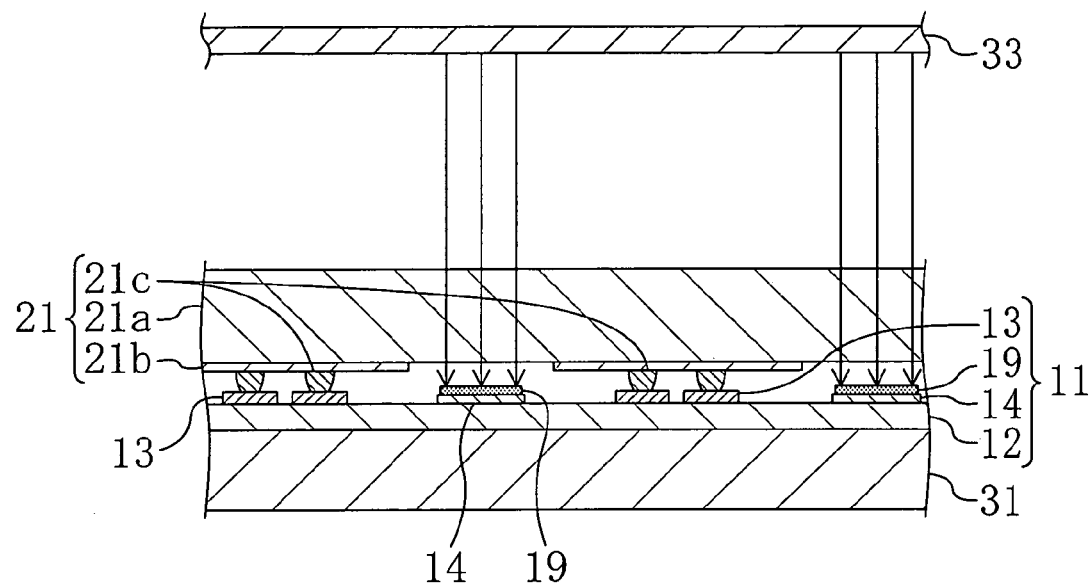
FIG. 8 is a partial sectional view of a wafer collective probe and a reliability evaluation wafer according to a fifth embodiment of the present invention when the probe is brought into contact with the wafer.

A wafer collective reliability evaluation device according to a fifth embodiment of the present invention is described referring to FIG. 8.

FIG. 8 is a partial sectional view of a wafer collective probe and a reliability evaluation wafer according to the present embodiment in the state in which the probe is made to contact with the wafer.

As shown in FIG. 8, the reliability evaluation wafer 11 is retained on the wafer tray 31, and the wafer collective probe 21 is disposed so as to face the reliability evaluation wafer 11. Further, an infrared-ray light source 33 is provided in an upper part of the wafer collective probe 21.

The anisotropic conductive rubber 21b is provided on the surface, which faces the reliability evaluation wafer 11, of the wiring substrate 21a provided in the wafer collective probe 21. The bumps 21c are provided in the surface of the anisotropic conductive rubber 21b and connected to the electrodes 13 provided in the reliability evaluation wafer 11. The reliability evaluation elements 14 and the electrodes 13 for applying voltage or current to the reliability evaluation elements 14 are provided on the semiconductor-wafer main body 12, which is the substrate of the reliability evaluation wafer 11. The reliability evaluation elements 14 and the electrodes 13 are connected by means of the wirings 16 (not shown). On the reliability evaluation elements 14 are formed deep-color heating elements 19 containing a relatively deep color so as to efficiently absorb irradiated infrared ray. A black chromium film, a copper oxide film or the like can be used as the deep-color heating elements.

Light-transmitting regions are provided in the wiring substrate 21a over above the deep-color heating elements 19. The anisotropic conductive rubber 21b is provided with slits, through which the infrared ray can be irradiated on the deep-color heating elements 19.

According to the wafer collective reliability evaluation device according to the present embodiment, at least one infrared-ray light source, though fewer than the number of the deep-color heating elements 19, can generate heat from a large number of deep-color heating elements 19 in the wafer surface, wherein a large number of reliability evaluation elements can be simultaneously evaluated by means of such a quite simplified temperature control system. As a further arrangement, the slits are provided in predetermined parts of the anisotropic conductive rubber 21b so that the infrared ray can be irradiated on only peripheral parts of the deep-color heating elements 19, and a light reflecting film having a surface of a mirror plane shape and made of aluminum and the like is formed on an upper surface or lower surface of the wiring substrate 21a, thereby minimizing a temperature increase due to radiation heat resulting from the infrared ray in the wafer collective probe.

(Sixth Embodiment)

Figure 9:
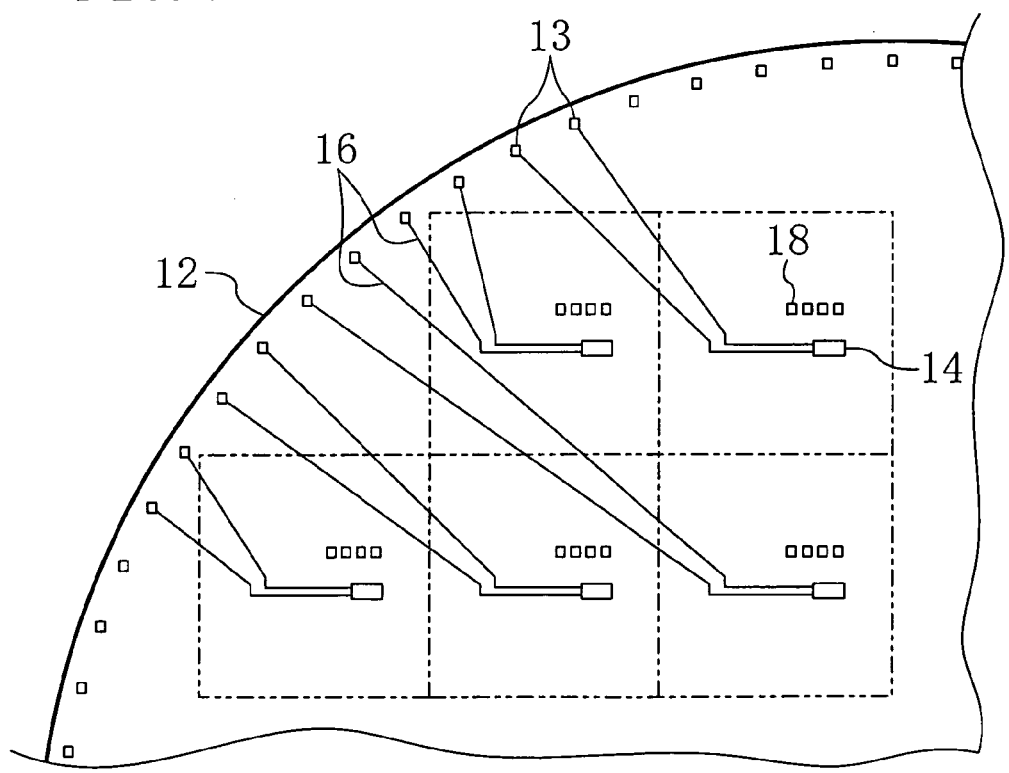
FIG. 9 is a partial schematic view of an evaluation wafer used for a wafer collective reliability evaluation according to a sixth embodiment of the present invention.
Figure 10:
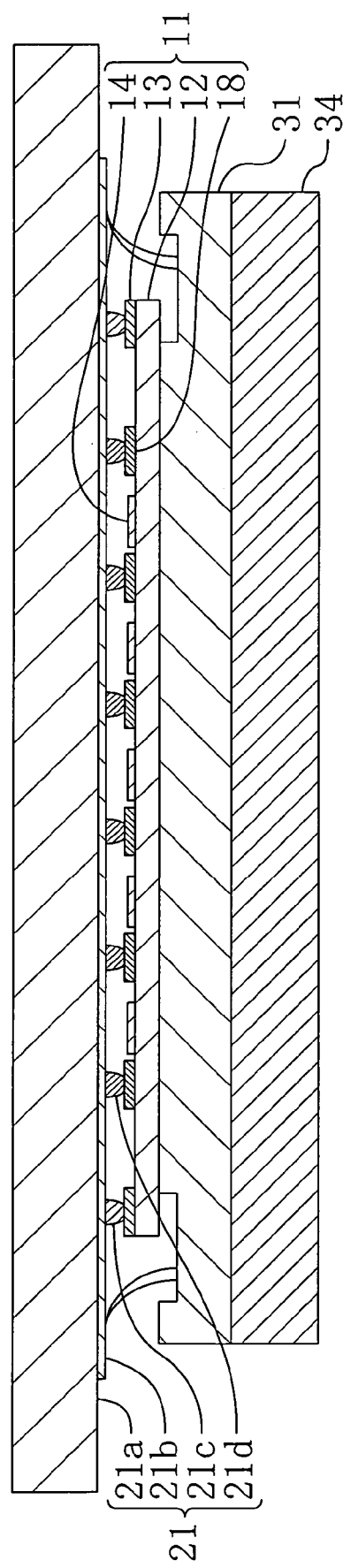
FIG. 10 is a sectional view of a wafer collective probe and the reliability evaluation wafer according to the sixth embodiment of the present invention when the probe is brought into contact with the wafer.

A wafer collective reliability evaluation device according to a sixth embodiment of the present invention is described referring to FIGS. 9 and 10.

FIG. 9 is a plane view of an evaluation wafer used for a wafer collective reliability evaluation according to the present embodiment.

As shown in FIG. 9, the reliability evaluation wafer 11 is comprised of the plurality of reliability evaluation elements 14 formed on the semiconductor-wafer main body 12 serving as the substrate, electrodes 13 respectively connected to the reliability evaluation elements 14, wirings 16 for electrically connecting the reliability evaluation elements 14 and electrodes 13, and the plurality of dummy electrodes 18 formed in a periphery of the reliability evaluation elements 14. The electrodes 13 according to the present embodiment are formed, not in the periphery of the reliability evaluation elements 14, but in an outer peripheral part of the reliability evaluation wafer 11. The insulation film evaluation element for transistor, electromigration evaluation element for wiring, or the like can be used as the reliability evaluation elements 14.

FIG. 10 is a sectional view of a wafer collective probe and the reliability evaluation wafer according to the present embodiment in the state in which the probe is made to contact with the wafer.

As shown in FIG. 10, the reliability evaluation wafer 11 is retained on the wafer tray 31. The wafer collective probe 21 is disposed so as to face the reliability evaluation wafer 11. The reverse surface of the wafer tray 31 and a heater 34 are in contact with each other.

The anisotropic conductive rubber 21b is provided on the surface, which faces the reliability evaluation wafer 11, of the wiring substrate 21a provided in the wafer collective probe 21. The bumps 21c are provided in the surface of the anisotropic conductive rubber 21b and connected to the electrodes 13 provided in the reliability evaluation wafer 11. Therefore, voltage or current can be applied to the reliability evaluation elements 14 from a power supply disposed outside of the wafer collective probe 21 via the wiring substrate 21, anisotropic conductive rubber 21b, bumps, 21c, electrodes 13 and wirings 16.

Further, the dummy bumps 21d are provided in the surface of the anisotropic conductive rubber 21 and connected to the dummy electrodes 18. Thereby, the wafer collective probe 21 can be unfailingly retained on the reliability evaluation wafer 11.

According to the present embodiment, the heater 34 is in contact with the reverse surface of the wafer tray 31. Heat supplied from the heater 34 is transmitted to the reliability evaluation wafer 11 via the wafer tray 31, and the respective reliability evaluation elements 14 are thereby heated to reach a predetermined temperature.

In the present embodiment, the electrodes 13 are disposed, not in the periphery of the reliability evaluation elements 14, but in the outer peripheral part of the semiconductor-wafer main body 12, which is the substrate of the reliability evaluation wafer 11. Therefore, the outer peripheral part of the semiconductor-wafer main body 12 is not in contact with the wafer tray 31. This makes it difficult for the heat from the heater 34 to be transmitted to the outer peripheral part of the wafer where the electrodes 13 are formed. As a result, a temperature in the outer peripheral part of the semiconductor-wafer main body 12 is lower than in a center part of the semiconductor-wafer main body 12 where the reliability evaluation elements 14 are formed. Because of that, the bumps 21c connected to the electrodes 13 provided in the outer peripheral part of the semiconductor-wafer main body 12 cannot be possibly heated to a high temperature, which eliminates the possibility of increasing the temperature of the anisotropic conductive rubber 21b having the potential problem of undergoing a significant deterioration at a high temperature. Thereby, the wafer collective reliability evaluation can be performed at a predetermined temperature.

In the reliability evaluation wafer 11 according to the present embodiment, the heating resistor elements 15 may be provided in the vicinity of the reliability evaluation elements 14 so that the reliability evaluation elements 14 can be heated in combination with the heater 34.

(Seventh Embodiment)

Figure 11:
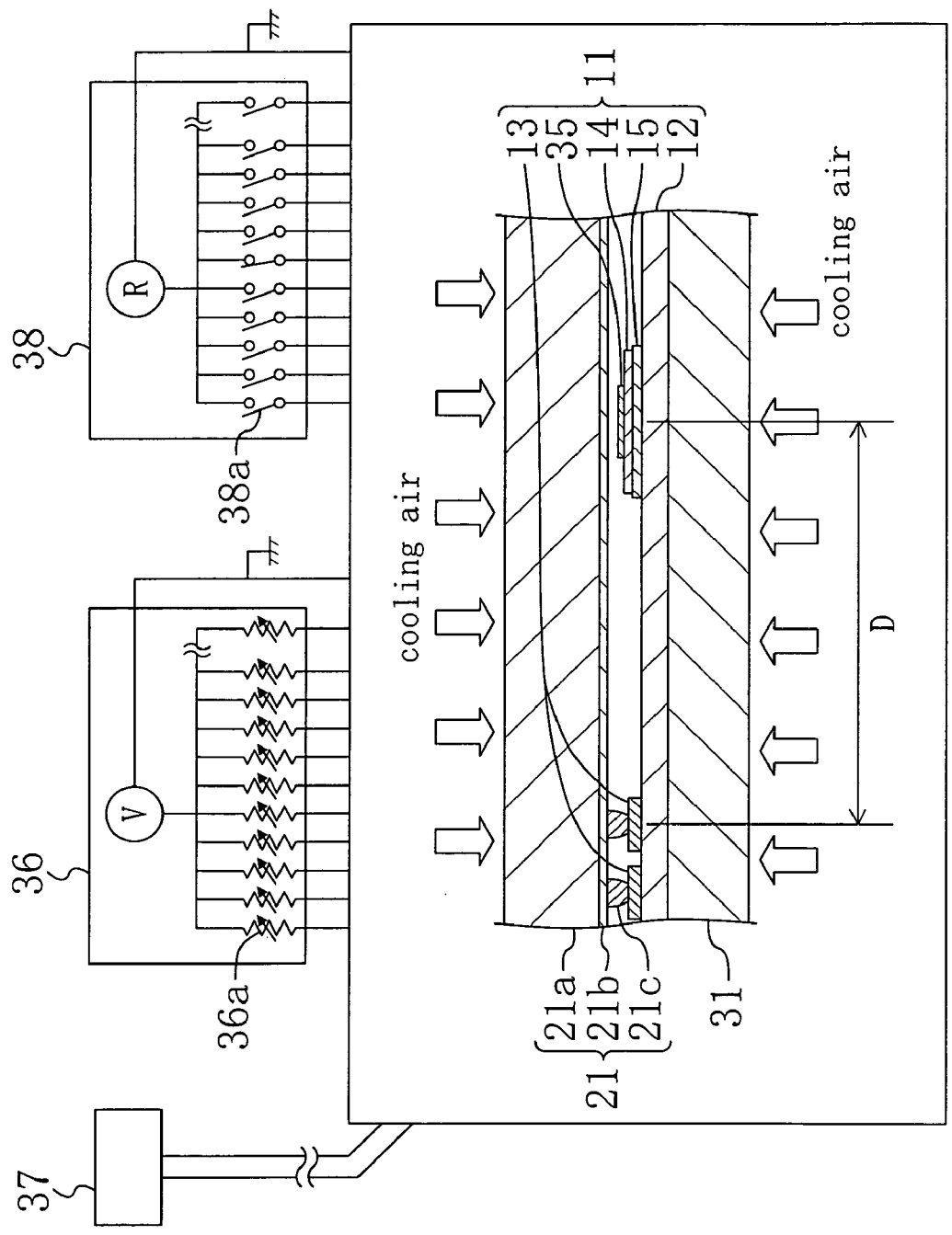
FIG. 11 is a partial sectional view of a wafer collective probe and a reliability evaluation wafer according to a seventh embodiment of the present invention when the probe is brought into contact with the wafer.

A wafer collective reliability evaluation method according to a seventh embodiment of the present invention is described referring to FIG. 11.

FIG. 11 is a partial sectional view of a wafer collective probe and a reliability evaluation wafer according to the present embodiment in the state in which the probe is made to contact with the wafer.

As shown in FIG. 11, the reliability evaluation wafer 11 is retained on the wafer tray 31, and the wafer collective probe 21 is disposed so as to face the reliability evaluation wafer 11. The anisotropic conductive rubber 21b is provided on the surface, which faces the reliability evaluation wafer 11, of the wiring substrate 21a provided in the wafer collective probe 21. The bumps 21c are provided in the surface of the anisotropic conductive rubber 21b and connected to the electrodes 13 provided in the reliability evaluation wafer 11.

The plurality of reliability evaluation elements 14 are formed on the semiconductor-wafer main body 12 as the substrate of the reliability evaluation wafer 11. The heating resistor elements 15 and temperature measuring resistor elements 35 are provided in contact with the reliability evaluation elements 14. The reliability evaluation elements 14, heating resistor elements 15 and temperature measuring resistor element 35 are respectively electrically connected to the electrodes 13 via the intervening wirings 16 (not shown). The electrodes 13 and the heating resistor elements 15 are formed at the distance D therebetween, as in the first embodiment.

In the state shown in FIG. 11, voltage or current from a temperature control power supply 36 and a stress application power supply 37 disposed outside of the wafer collective probe 21 is supplied to the reliability evaluation 14 and the heating resistor elements 15 via the wiring substrate 21a, anisotropic conductive rubber 21b, bumps 21c, electrodes 13 and wirings 16. At that time, the temperature measuring resistor elements 35 formed in contact with the reliability evaluation elements 14 are connected to a resistance measuring unit 38 via the wirings 16, electrodes 13, bumps 21c, anisotropic conductive rubber 21b and wring substrate 21a.

When relays 38a of the resistance measuring unit 38 are individually closed to thereby measure resistance values, respective resistance values of the temperature measuring resistor elements 35 can be read. The read resistance values are converted into temperatures to thereby measure a temperature of each temperature measuring resistor element 35, that is, the temperature of each reliability evaluation element 14 in contact with the temperature measuring resistor element. Therefore, the evaluation temperatures of the respective reliability evaluation elements 14 in a reliability evaluation test can be precisely known.

Further, when voltage or current to be supplied to the respective heating resistor elements 15 is adjusted by adjusting values of variable resistances 36a in the temperature control power supply 36 based on the temperatures measured by means of the resistance measuring unit 38, the reliability evaluation elements 14 can be maintained at a predetermined temperature. In the foregoing manner, a variation in the evaluation temperatures can be eliminated to thereby perform the reliability evaluation under precise temperature conditions.

The heating resistor elements 15 and the temperature measuring resistor elements 35 are only required to be disposed at any position where the reliability evaluation elements 14 can be locally heated and the temperatures of the reliability evaluation elements 14 can be measured, and not necessarily disposed in contact with the reliability evaluation elements 14. As the temperature measuring resistor elements can be used a thermistor, a platinum resistor element or the like.

According to the present embodiment, the temperature measuring resistor elements are incorporated into the reliability evaluation wafer exhibited in the first embodiment. The temperature measuring resistor elements may be incorporated into any of the reliability evaluation wafers exhibited in the first through sixth embodiments.

(Eighth Embodiment)

Figure 12:
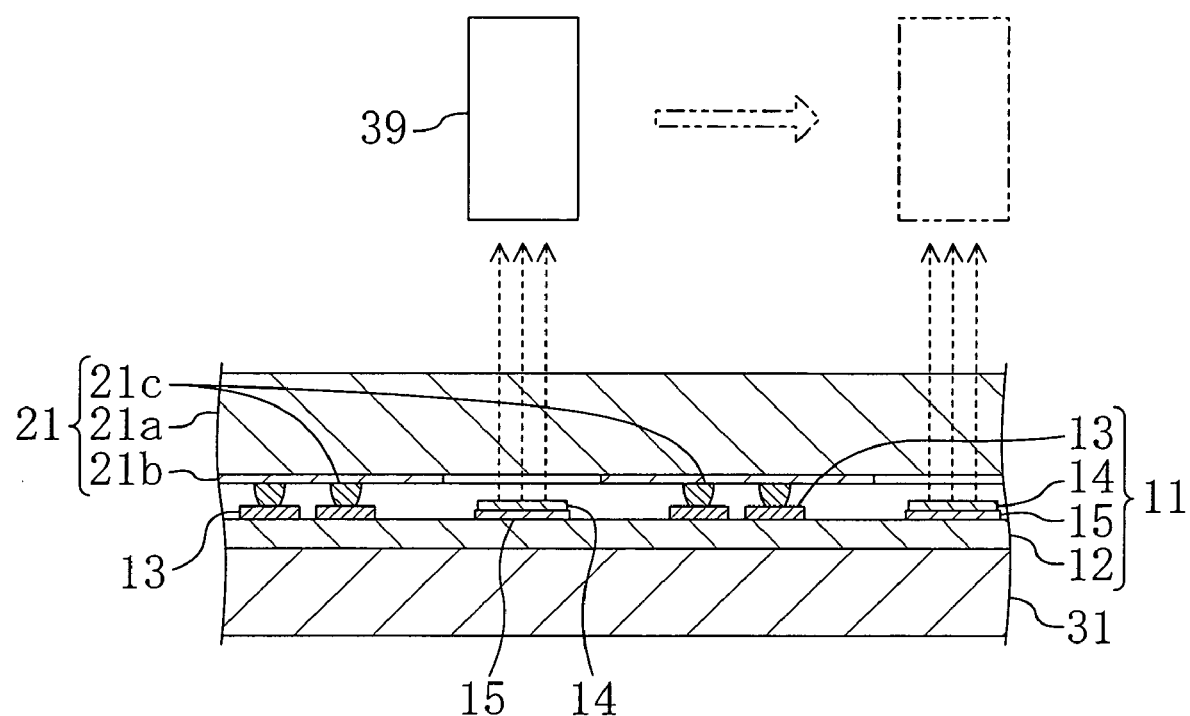
FIG. 12 is a partial sectional view of a wafer collective probe and a reliability evaluation wafer according to an eighth embodiment of the present invention when the probe is brought into contact with the wafer.
Figure 13:
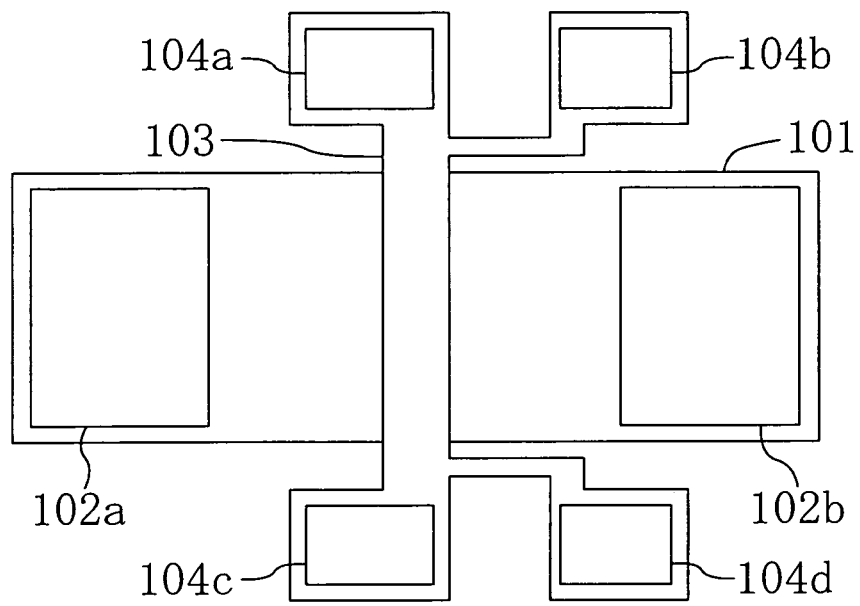
FIG. 13 is a schematic illustration of an evaluation pattern according to a first conventional example.
Figure 14:
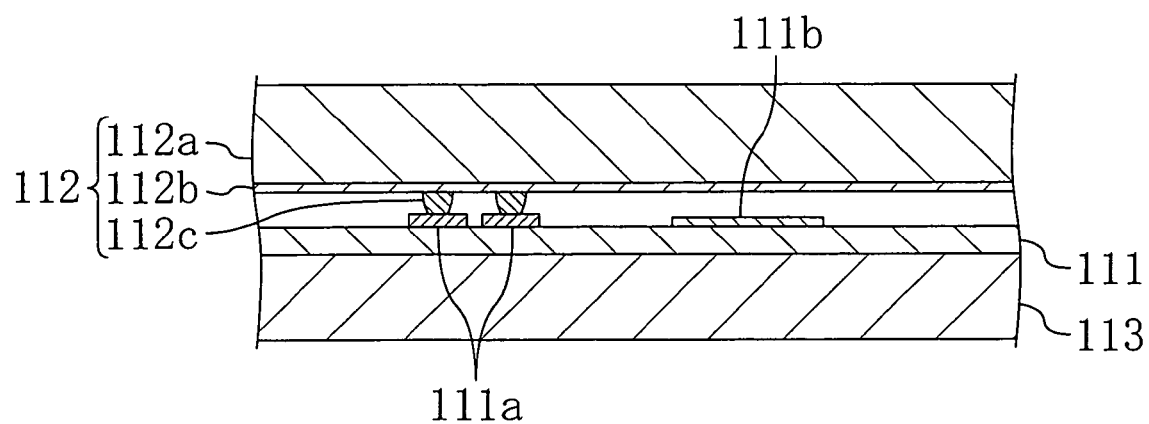
FIG. 14 is a partial sectional view of a wafer collective probe and a reliability evaluation wafer according to a second conventional example when the probe is brought into contact with the wafer.

A wafer collective reliability evaluation method according to an eighth embodiment of the present invention is described referring to FIG. 12.

FIG. 12 is a partial sectional view of a wafer collective probe and a reliability evaluation wafer according to the present embodiment in the state in which the probe is made to contact with the wafer.

As shown in FIG. 12, the reliability evaluation wafer 11 is retained on the wafer tray 31, and the wafer collective probe 21 is disposed so as to face the reliability evaluation wafer 11. Further, an infrared-ray energy detecting unit 39 is provided in the upper part of the wafer collective probe 21. The anisotropic conductive rubber 21b is provided on the surface, which faces the reliability evaluation wafer 11, of the wiring substrate 21a provided in the wafer collective probe 21. The bumps 21c are provided in the surface of the anisotropic conductive rubber 21b and connected to the electrodes 13 provided in the reliability evaluation wafer 11.

The plurality of reliability evaluation elements 14 are formed on the semiconductor-wafer main body 12 as the substrate of the reliability evaluation wafer 11. The heating resistor elements 15 and temperature measuring resistor elements 35 are provided in contact with the reliability evaluation elements 14. The reliability evaluation elements 14, heating resistor elements 15 and temperature measuring resistor elements 35 are respectively electrically connected to the electrodes 13 by means of the intervening wirings 16 (not shown).

The light-transmitting regions are provided in the wiring substrate 21a immediately above the reliability evaluation elements 14. The anisotropic conductive rubber 21b is provided with the slits, through which infrared ray emitted from the reliability evaluation elements 14 can be transmitted outside the wafer collective probe. In the foregoing case, the wiring substrate 21a is preferably made of a material having a large infrared-ray permeability such as silica glass.

In the state shown in FIG. 12, voltage or current from a power supply (not shown) disposed outside of the wafer collective probe 21 is supplied to the reliability evaluation elements 14 and heating resistor elements 15 via the wiring substrate 21a, anisotropic conductive rubber 21b, bumps 21c electrodes 13 and wirings 16. At that time, the reliability evaluation elements 14 are heated by the heating resistor elements 15 formed in contact with the reliability evaluation elements 14, and the infrared ray is thereby emitted from the reliability evaluation elements 14. The infrared ray emitted from the reliability evaluation elements 14 transmits through the slits provided in the anisotropic elastic rubber 21b and the wafer collective probe to finally reach the infrared-ray energy detecting unit 39 disposed outside the wafer collective probe.

There is a correlation between an infrared-ray energy emitted from a material and a temperature. Therefore, the temperatures of the reliability evaluation elements 14 can be measured by converting a detection result obtained by the infrared-ray energy detecting unit 39. Further, the temperatures of all of the reliability evaluation elements 14 provided on the reliability evaluation wafer 11 can be measured by accordingly moving the infrared-ray energy detecting unit 39.

When the temperature control power supply described in the present embodiment is used as the power supply for supplying voltage or current to the heating resistor elements 15, the current or voltage supplied to the heating resistor elements 15 can be adjusted based on the temperatures of the reliability evaluation elements 14 measured by the infrared-ray energy detecting unit 39 to thereby maintain the respective reliability evaluation elements 14 at a predetermined temperature.

The reliability evaluation elements 14 and the heating resistor elements 15 are not necessarily in contact with each other. It is only required that the reliability evaluation elements 14 be locally heated by the heating resistor elements 15. The same effect can be achieved when the temperatures of the heating resistor elements 15, in place of the reliability evaluation elements 14, are measured by the infrared-ray energy detecting unit 39.

As thus far described, the wafer collective reliability evaluation device according to the present invention can realize a wafer collective reliability evaluation device and a wafer collective reliability evaluation method capable of collectively performing a reliability evaluation test with respect to a wafer in a short period of evaluation time and under broad-ranging and precise temperature conditions. Therefore, the wafer collective reliability evaluation device according to the present invention is effective for a wafer collective reliability evaluation device and a wafer collective reliability evaluation method for collectively performing the reliability evaluation with respect to a plurality of reliability evaluation elements formed on a semiconductor wafer.

What is claimd is:

1. A wafer collective reliability evaluation device comprising,
    a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, wherein
    the reliability evaluation wafer comprises a plurality of reliability evaluation elements formed on a main body of a semiconductor wafer, a plurality of electrodes for applying voltage or current to the respective reliability evaluation elements via the respective metal terminals and a plurality of heating elements formed in a vicinity of the respective reliability evaluation elements and serving to control temperatures of the respective reliability evaluation elements.

2. The wafer collective reliability evaluation device as claimed in claim 1, wherein
    the plurality of heating elements are respectively heating resistor elements and a temperature control power supply for applying the voltage or the current to the respective heating resistor elements is further provided.

3. The wafer collective reliability evaluation device as claimed in claim 2, wherein
    the reliability evaluation wafer further includes temperature sensors for measuring temperatures of the reliability evaluation elements provided in the vicinity of the reliability evaluation elements.

4. The wafer collective reliability evaluation device as claimed in claim 3, wherein
    the temperature sensors are temperature measuring resistor elements in which resistance values are variable in response to a temperature.

5. The wafer collective reliability evaluation device as claimed in claim 2, further comprising a temperature sensor using infrared ray for measuring temperatures of the reliability evaluation elements provided outside of the wafer collective probe.

6. The wafer collective reliability evaluation device as claimed in claim 3, further comprising a control circuit for adjusting a value of the voltage or the current applied to the respective heating resistor elements by the temperature control power supply in response to measurement results of the temperature sensors.

7. The wafer collective reliability evaluation device as claimed in claim 1, wherein
a wafer tray for retaining the reliability evaluation wafer is further provided, and the reliability evaluation elements are cooled off by supplying cooling air to a surface of the wafer tray on an opposite side with respect to a wafer retaining surface thereof or a surface of the wafer collective probe on an opposite side with respect to a surface facing the reliability evaluation wafer.

8. A wafer collective reliability evaluation device comprising,
a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, wherein
the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and
the respective heating elements and the respective electrodes are disposed at a distance therebetween so that temperatures of the electrodes are equal to or below a deterioration temperature of the conductive elastic sheet when the reliability evaluation elements are heated to a predetermined evaluation temperature by the respective heating elements formed on the reliability evaluation wafer.

9. The wafer collective reliability evaluation device as claimed in claim 8, wherein
when a maximum degree of the predetermined evaluation temperature is T° C., and the distance between the respective electrodes and the respective heating elements is D mm, a relationship represented by D>{log (T−25)−log(125)}×2.5 is satisfied.

10. The wafer collective reliability evaluation device as claimed in claim 8, wherein the distance between the respective electrodes and the respective heating elements is at least 0.5 mm.

11. The wafer collective reliability evaluation device as claimed in claim 8, wherein
a wafer tray for retaining the reliability evaluation wafer is further provided, and the reliability evaluation elements are cooled off by supplying cooling air to a surface of the wafer tray on an opposite side with respect to a wafer retaining surface thereof or a surface of the wafer collective probe on an opposite side with respect to a surface facing the reliability evaluation wafer.

12. A wafer collective reliability evaluation device comprising,
a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, wherein
the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and
the respective electrodes are formed on a heat insulation material provided on the main body of the semiconductor wafer.

13. The wafer collective reliability evaluation device as claimed in claim 12, wherein the heat insulation material is a surface protection resin film formed on the main body of the semiconductor wafer.

14. The wafer collective reliability evaluation device as claimed in claim 12, wherein the heat insulation material is formed from a material having a heat conductivity of at most 1 W/m·K.

15. The wafer collective reliability evaluation device as claimed in claim 12, wherein
a wafer tray for retaining the reliability evaluation wafer is further provided, and the reliability evaluation elements are cooled off by supplying cooling air to a surface of the wafer tray on an opposite side with respect to a wafer retaining surface thereof or a surface of the wafer collective probe on an opposite side with respect to a surface facing the reliability evaluation wafer.

16. A wafer collective reliability evaluation device comprising,
a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, wherein
the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and
dummy metal terminals for releasing heat are provided in the surface of the conductive elastic sheet in the wafer collective probe and the dummy metal terminals are in contact with a surface of the reliability evaluation wafer between the respective electrodes and the respective heating elements.

17. The wafer collective reliability evaluation device as claimed in claim 16, wherein the dummy metal terminals are connected to the reliability evaluation wafer via intervening dummy electrodes formed on the surface of the reliability evaluation wafer.

18. The wafer collective reliability evaluation device as claimed in claim 16, wherein
a wafer tray for retaining the reliability evaluation wafer is further provided, and the reliability evaluation elements are cooled off by supplying cooling air to a surface of the wafer tray on an opposite side with respect to a wafer retaining surface thereof or a surface of the wafer collective probe on an opposite side with respect to a surface facing the reliability evaluation wafer.

19. A wafer collective reliability evaluation device comprising:
a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer; and
a wafer tray for retaining the reliability evaluation wafer, wherein
the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and
a cooling means for selectively cooling off a region near the respective electrodes is provided.

20. The wafer collective reliability evaluation device as claimed in claim 19, wherein the cooling means is projections provided on an upper part of the wafer tray and in contact with a surface of the reliability evaluation wafer on an opposite side with respect to a region thereof where the electrodes are formed.

21. The wafer collective reliability evaluation device as claimed in claim 19, wherein the cooling means is Pertier elements incorporated into the region near the electrodes in a reverse surface of the wafer tray.

22. The wafer collective reliability evaluation device as claimed in claim 19, wherein the cooling means is cooling air supplied to the region near the electrodes in a reverse surface of the wafer tray.

23. The wafer collective reliability evaluation device as claimed in claim 8, wherein the plurality of heating elements are respectively heating resistor elements, and a temperature control power supply for applying voltage or current to the respective heating resistor elements is further provided.

24. The wafer collective reliability evaluation device as claimed in claim 23, wherein the reliability evaluation wafer further includes temperature sensors for measuring temperatures of the reliability evaluation elements formed in the vicinity of the reliability evaluation elements.

25. The wafer collective reliability evaluation device as claimed in claim 24, wherein the temperature sensors are temperature measuring resistor elements in which resistance values are variable in response to a temperature.

26. The wafer collective reliability evaluation device as claimed in claim 23, further comprising a temperature sensor using infrared ray for measuring the temperatures of the reliability evaluation elements provided outside of the wafer collective probe.

27. The wafer collective reliability evaluation device as claimed in claim 24, further comprising a control circuit for adjusting a value of the voltage or the current applied to the respective heating resistor elements by the temperature control power supply in response to measurement results of the temperature sensors.

28. A wafer collective reliability evaluation device comprising,
a wafer collective probe disposed so as to face a reliability evaluation wafer and including a wiring substrate, a conductive elastic sheet provided on a surface of the wiring substrate facing the reliability evaluation wafer and a plurality of metal terminals provided in a surface of the conductive elastic sheet and electrically connected to the reliability evaluation wafer, wherein
the reliability evaluation wafer comprises a plurality of reliability evaluation elements formed on a main body of a semiconductor wafer, a plurality of heating elements formed in a vicinity of the respective reliability evaluation elements and serving to control temperatures of the respective reliability evaluation elements, a plurality of electrodes for applying voltage or current to the respective reliability evaluation elements via the respective metal terminals and a plurality of wirings for electrically connecting the respective reliability evaluation elements and the respective electrodes, and
the plurality of heating elements are heated by infrared ray emitted from a light source provided outside of the wafer collective probe to thereby adjust the temperatures of the respective reliability evaluation elements.

29. The wafer collective reliability evaluation device as claimed in claim 28, wherein a light reflecting film is formed on an upper surface or a lower surface of the wiring substrate.

30. A wafer collective reliability evaluation method using:
a reliability evaluation wafer including a plurality of reliability evaluation elements formed on a main body of a semiconductor wafer, a plurality of heating elements formed in a vicinity of the respective reliability evaluation elements and serving to control temperatures of the respective reliability evaluation elements and a plurality of electrodes respectively electrically connected to the plurality of reliability evaluation elements; and
a wafer collective probe including a wiring substrate, a conductive elastic sheet provided in a surface of the wiring substrate and a plurality of metal terminals provided in a surface of the conductive elastic sheet, and comprising:
a step for electrically connecting the respective metal terminals of the wafer collective probe to the respective electrodes of the reliability evaluation wafer;
a step for increasing the temperatures of the respective reliability evaluation elements to a predetermined evaluation temperature by generating heat from the respective heating elements; and
a step for collectively evaluating states of the respective reliability evaluation elements at the predetermined evaluation temperature by means of the wafer collective probe electrically connected to the respective reliability evaluation elements via the respective electrodes and the respective metal terminals.

31. The wafer collective reliability evaluation method as claimed in claim 30, wherein the plurality of heating elements are respectively heating resistor elements, and voltage or current is applied to the respective heating resistor elements to thereby generate heat from the respective heating resistor elements.

32. The wafer collective reliability evaluation method as claimed in claim 30, wherein
the reliability evaluation wafer includes temperature measuring resistor elements in which resistance values are variable in response to a temperature in a vicinity of the respective reliability evaluation elements, and further comprising:
a step for measuring the temperatures of the respective reliability evaluation elements by measuring the resistance values of the respective temperature measuring resistor elements; and
a step for controlling the temperatures of the respective reliability evaluation elements by adjusting heat generation volumes of the respective heating elements in response to the measured temperatures of the respective reliability evaluation elements.

33. The wafer collective reliability evaluation method as claimed in claim 30, further comprising:
a step for measuring the temperatures of the respective reliablity evaluation elements by measuring radiation energy of the infrared ray emitted from the respective heating elements; and
a step for controlling the temperatures of the respective reliability evaluation elements by adjusting heat generation volumes of the respective heating elements in response to the measured temperatures of the respective reliability evaluation elements.

* * * * *